United States Patent [19]

Dhong et al.

[11] Patent Number: 4,988,637
[45] Date of Patent: Jan. 29, 1991

[54] METHOD FOR FABRICATING A MESA TRANSISTOR-TRENCH CAPACITOR MEMORY CELL STRUCTURE

[75] Inventors: Sang H. Dhong, Mahopac; Wei Hwang, Armonk, both of N.Y.

[73] Assignee: International Business Machines Corp., Armonk, N.Y.

[21] Appl. No.: 546,194

[22] Filed: Jun. 29, 1990

[51] Int. Cl.$^5$ .......................................... H01L 21/70
[52] U.S. Cl. .......................................... 437/52; 437/47; 437/48; 437/60; 437/89; 437/191; 437/228; 437/203; 437/233; 437/919
[58] Field of Search ............. 437/38, 47, 48, 52, 437/60, 89, 83, 186, 191, 195, 203, 228, 233, 235, 919; 357/23.6, 51

[56] References Cited

U.S. PATENT DOCUMENTS

| Re. 32,090 | 6/1986 | Jaccodine et al. | 357/51 |
|---|---|---|---|
| 4,728,623 | 3/1988 | Lu et al. | 437/52 |
| 4,734,384 | 3/1988 | Tsuchiya | 437/52 |
| 4,751,557 | 6/1988 | Sunami et al. | 357/23.6 |
| 4,761,385 | 8/1988 | Pfiester | 437/52 |
| 4,791,463 | 12/1988 | Malhi | 357/23.12 |
| 4,801,989 | 1/1989 | Taguchi | 357/23.6 |
| 4,803,535 | 2/1989 | Taguchi | 357/23.6 |
| 4,816,884 | 3/1989 | Hwang et al. | 357/23.6 |
| 4,820,652 | 4/1989 | Hayashi | 437/52 |
| 4,830,978 | 5/1989 | Teng et al. | 437/67 |
| 4,833,515 | 5/1989 | Hwang et al. | 357/23.6 |

OTHER PUBLICATIONS

Lu et al., "Three-Dimensional Single-Crystal Dynamic Ram Cell", IBM Technical Disclosure Bulletin, vol. 31, No. 12, May 1989, pp. 302-304.
Nicky C. C. Lu, "Advanced Cell Structures for Dynamic Rams", IEEE Circuits and Devices Magazine, Jan. 1989, pp. 27-36.

*Primary Examiner*—Brian E. Hearn
*Assistant Examiner*—Tom Thomas
*Attorney, Agent, or Firm*—Perman & Green

[57] ABSTRACT

A method is described for fabricating a DRAM cell in a monocrystalline substrate wherein the cell includes an FET transistor and a capacitor. The method includes the steps of providing a buried storage capacitor in a trench in the substrate; forming a semiconductor mesa area juxtaposed to the buried storage capacitor; opening a channel to a contact of the storage capacitor; depositing a semiconductor layer over the mesa area and in the opened channel; removing a substantial portion of the conductive layer while leaving at least a connecting portion of the conductive layer deposited in the channel and in communication with the semiconductor mesa; and forming an FET gate structure including a source and drain on the mesa whereby the connecting conductive portion provides a conductive path between the FET and the capacitor.

9 Claims, 6 Drawing Sheets

METHOD FOR FABRICATING A MESA TRANSISTOR-TRENCH CAPACITOR MEMORY CELL STRUCTURE

FIELD OF THE INVENTION

This invention relates to dynamic random access memory (DRAM) circuits and more particularly to a method for fabricating a mesa transistor-trench capacitor combination for such DRAM circuits.

BACKGROUND OF THE INVENTION

As the requirements for increased density DRAM circuits have evolved, many DRAM semiconductor structures have been suggested. A common feature to those suggested structures has been an attempted minimization of the surface area required for a memory cell, as that surface area is a limiting factor in the total number of cells that can be included on a single chip.

The preferred DRAM cell, from the standpoint of minimum area, is the one transistor, one capacitor cell. As the amount of signal charge that can be stored on the capacitor is a function of its area, considerable effort has been expended in designing a larger capacitor. In this regard, the prior art has employed "trench" capacitors and various methods of interconnecting such capacitors with surface-located transistors. To further DRAM cell technology, the prior art has employed mesa-style transistors in combination with trench capacitors. Nevertheless, as cell sizes have shrunk, method for fabricating such cells with reliable transistor-to-capacitor interconnections have become increasingly demanding.

The following references are representative of the prior art.

U.S. Pat. Re. No. 32,090, reissued Mar. 4, 1986 to Jaccodine et al., entitled Silicon Integrated Circuits, discloses a DRAM in which individual cells, including an access transistor and a storage capacitor, are formed on mesas formed on a silicon chip. The cell's access transistor is formed on the top surface of a silicon mesa. One plate of the cell's storage capacitor is formed by a sidewall of the mesa and the other plate by doped polycrystalline silicon which fills grooves surrounding the mesa, isolated therefrom by a silicon dioxide layer.

U.S. Pat. No. 4,728,623, issued Mar. 1, 1988 to Lu et al., entitled Fabrication Method for Forming A Self-Aligned Contact Window and Connection In An Epitaxial Layer and Device Structures Employing The Method, describes a fabrication process for providing an epitaxial layer on a silicon substrate and over predefined insulator-capped islands to form a self-aligned contact window in the epitaxial layer. Application of the method to a three-dimensional DRAM device structure is shown, with an access transistor formed in monocrystalline silicon stacked on top of a trench capacitor. A contact window for the source-to-trench connection is formed by self-aligned lateral epitaxial growth, followed by a contact-connection formations step using either a second epitaxial growth or a CVD refill and strapping process.

U.S. Pat. No. 4,734,384, issued Mar. 29, 1988 to Tsuchiya, entitled Process For Manufacturing Semiconductor Memory Device, discloses a DRAM having a memory cell including a capacitor element, utilizing a trench or moat formed in a semiconductor substrate, and a MISFET. One of the electrodes of the capacitor element is connected to a MISFET at the sidewall of an upper end of a moat which forms the capacitor element. This electrode is connected in self-alignment with a semiconductor region, which serves as either the source or drain of the MISFET.

U.S. Pat. No. 4,751,557, issued June 14, 1988 to Sunami et al., entitled DRAM With FET Stacked Over Capacitor, teaches a semiconductor memory wherein a part of each capacitor is formed on sidewalls of an island region surrounded by a recess formed in a semiconductor substrate. The island region and other regions are electrically isolated by the recess.

U.S. Pat. No. 4,761,385, issued Aug. 2, 1988 to Pfiester, entitled Forming A Trench Capacitor, discloses a trench capacitor having increased capacitance. By means of an oxidation enhanced diffusion (OED) effect, locally outdiffused regions in the doped substrate of a semiconductor material are formed. Thus, greater capacitance is achieved for a trench capacitor of equal depth.

U.S. Pat. No. 4,791,463, issued Dec. 13, 1988 to Malhi, entitled Structure for Contacting Devices In Three Dimensional Circuitry, describes a DRAM cell which provides a one-transistor/one-capacitor DRAM cell structure. An array is shown in which the cell transistor is formed on the sidewalls of a substrate trench containing the cell capacitor. The word and bit lines cross over the trench. One capacitor plate, the transistor channel and a source region are formed in the bulk sidewall of the trench. The transistor's gate and the other plate of the capacitor are both formed in polysilicon in the trench, but are separated from each other by an oxide layer inside the trench. Signal charge is stored on the polysilicon capacitor plate by an electrical connection of the source region with the polysilicon capacitor plate.

U.S. Pat. No. 4,801,989, issued Jan. 31, 1989 to Taguchi, entitled Dynamic Random Access Memory Having Trench Capacitor With Polysilicon Lined Lower Electrode, discloses a DRAM having a trench capacitor, which includes a first conductive layer formed on all of the inner surface of the trench, except for a region adjacent to the open portion of the trench. A dielectric layer is formed on the first conductive layer in the trench and on the surface of the semiconductor substrate. A second conductive layer, of the opposite conduction type, fills in the trench. The first conductive layer, the dielectric layer, and the second conductive layer constitute a storage capacitor. A metal insulator semiconductor transistor is formed in the semiconductor substrate and has a source or drain region in contact with the second conductive layer of the capacitor through the dielectric layer.

U.S. Pat. No. 4,803,535, issued Feb. 7, 1989 to Taguchi, entitled Dynamic Random Access Memory Trench Capacitor, discloses a DRAM with a trench capacitor. It includes a semiconductor substrate, a trench formed in the substrate, an insulating layer formed on an inner surface of the trench and having a bottom opening, and a first conductive layer formed at the bottom opening and on the insulating layer. The first conductive layer is ohmically connected to the semiconductor substrate at the bottom opening. The device also includes a dielectric layer formed on the first conductive layer and a second conductive layer formed on the dielectric layer so as to fill the trench. The first conductive layer, the dielectric layer and the second conductive layer constitute a charge storage capacitor. An MIS transistor is formed in the semiconductor substrate, and the second conductive layer is ohmically connected to its source or drain region.

U.S. Pat. No. 4,820,652, issued Apr. 11, 1989 to Hayashi, entitled Manufacturing Process and Structure of Semiconductor Memory Devices, discloses a manufacturing process and structure for a DRAM, each memory cell of which comprises one transistor and one capacitor. The disclosed process comprises the steps of selectively forming an insulating layer on a semiconductor substrate, and forming a semiconductor layer on the insulating layer, the semiconductor layer being connected to the semiconductor substrate via the insulating layer. A protective layer is then formed on the semiconductor layer, and includes a window having a predetermined width at a position offset from an end of the insulating layer and forming a trench through the window, with the insulating layer and protective layer serving as masks so that the semiconductor layer is still connected to the semiconductor substrate via the end of the insulating layer. A capacitor is then formed in the trench and a transistor in the semiconductor layer. Both transistor and capacitor are connected to a region of the semiconductor substrate adjacent to a sidewall of the insulating layer.

U.S. Pat. No. 4,830,978, issued May 16, 1989 to Teng et al., entitled DRAM Cell and Method, describes a memory cell formed within a single trench. A trench is formed in the surface of a semiconductor substrate. The bottom portion of the trench is filled with polycrystalline silicon to form one plate of a storage capacitor. The substrate serves as the other plate of the capacitor. The remaining portion of the trench is then filled with an insulating material such as silicon dioxide. A pattern is then etched into the silicon dioxide which opens a portion of the sidewall and the top portion of the trench down to the polycrystalline capacitor plate. A contact is formed between the polycrystalline capacitor plate and the substrate. Dopant atoms diffuse through the contact to form a source region on a sidewall of the trench. A gate insulator is formed by oxidation and a drain is formed at the surface of the trench adjacent to the mouth of the trench. Conductive material is formed inside the upper portion of the trench, thereby connecting the upper plate of the storage capacitor to a drain region on the surface of the semiconductor substrate.

U.S. Pat. No. 4,833,516, issued May 23, 1989 to Hwang et al., entitled High Density Memory Cell Structure Having A Vertical Trench Transistor Self-Aligned With A Vertical Trench Capacitor and Fabrication Methods Therefor, describes a high density, vertical trench transistor and trench capacitor DRAM cell. The cell incorporates a semiconductor substrate and an epitaxial layer thereon including a vertical transistor disposed in a shallow trench stacked above and self-aligned with a capacitor in a deep trench. The stacked vertical transistor has a channel partly on the horizontal surface and partly along the shallow trench sidewalls. Three sidewalls of an access transistor are surrounded by thick oxide isolation and the remaining side is connected to drain and bitline contacts. The memory cell is located inside an n-well and uses the n-well and heavily-doped substrate as the capacitor counter-electrode plate. The cell storage node is the polysilicon inside the trench capacitor.

In a publication by Dhong et al., entitled "High Density Memory Cell Structure with Two Access Transistors," in IBM Technical Disclosure Bulletin, December 1988, pages 409-417, a technique is described whereby a high density DRAM cell structure incorporates a pair of access transistors and a capacitor. Typically, MOS DRAM cells, which contain one access transistor and one storage capacitor, have signal-to-noise ratio and alpha-particle induced soft error limitations. To increase the packing density, reduce the soft errors and provide higher noise immunity, the publication describes a three-dimensional DRAM structure, consisting of a pair of transistors and a capacitor.

A publication by Lu et al., entitled "Three-Deminsional Single-Crystal Dynamic RAM Cell," in the IBM Technical Disclosure Bulletin, May 1989, pages 302-305, describes a three-deminsional DRAM cell which eliminates the oxide layer between the transistor body and polysilicon inside the trench and allows a source region to have good registration to the polysilicon inside the trench.

Accordingly, it is an object of this invention to provide an improved DRAM cell exhibiting minimal semiconductor area coverage.

It is another object of this invention to provide a method of fabrication for a DRAM cell wherein the interconnection between the cell capacitor and access transistor is self-aligned during the production process.

It is still another object of this invention to provide a method for fabricating an improved DRAM cell wherein, at times during its construction, planar surfaces are exhibited, thereby enabling simplified processing steps.

SUMMARY OF THE INVENTION

A method is described for fabricating a DRAM cell in a monocrystalline substrate wherein the cell includes an FET transistor and a capacitor. The method includes the steps of providing a buried storage capacitor in a trench in the substrate; forming a semiconductor mesa area juxtaposed to the buried storage capacitor; opening a channel to a contact of the storage capacitor; depositing a semiconductor layer over the mesa area and in the opened channel; removing a substantial portion of the conductive layer while leaving at least a connecting portion of the conductive layer deposited in the channel and in communication with the semiconductor mesa; and forming an FET gate structure including a source and drain on the mesa whereby the connecting conductive portion provides a conductive path between the FET and the capacitor.

DETAILED DESCRIPTION OF THE INVENTION

Figure 1:
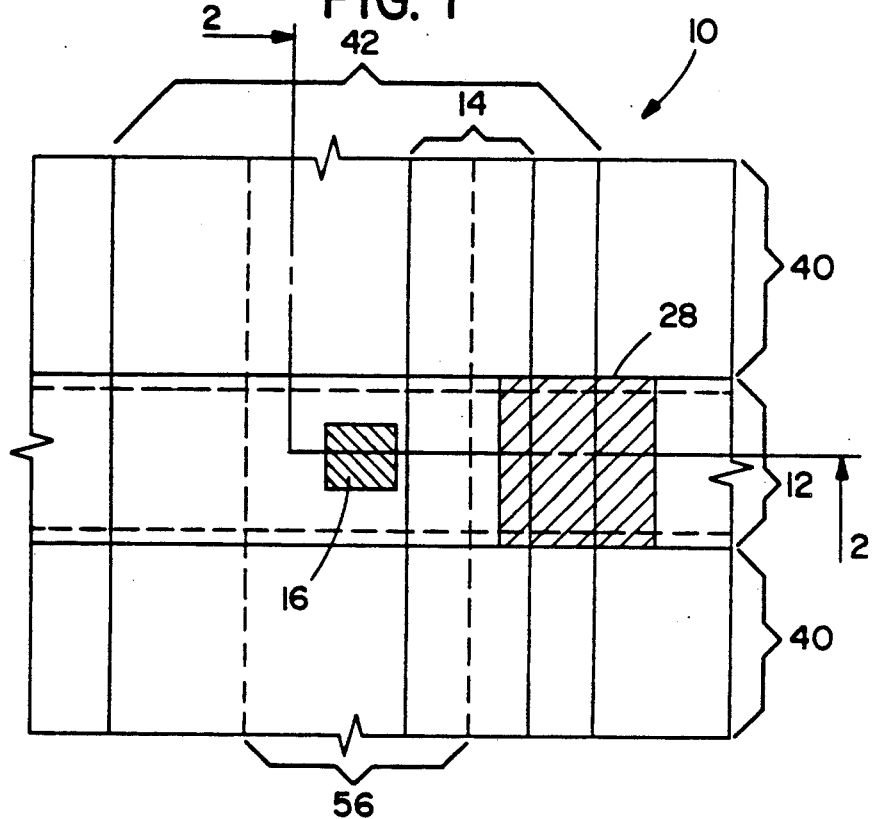
FIG. 1 is a plan view of DRAM memory cell constructed in accordance with the invention.
Figure 2:
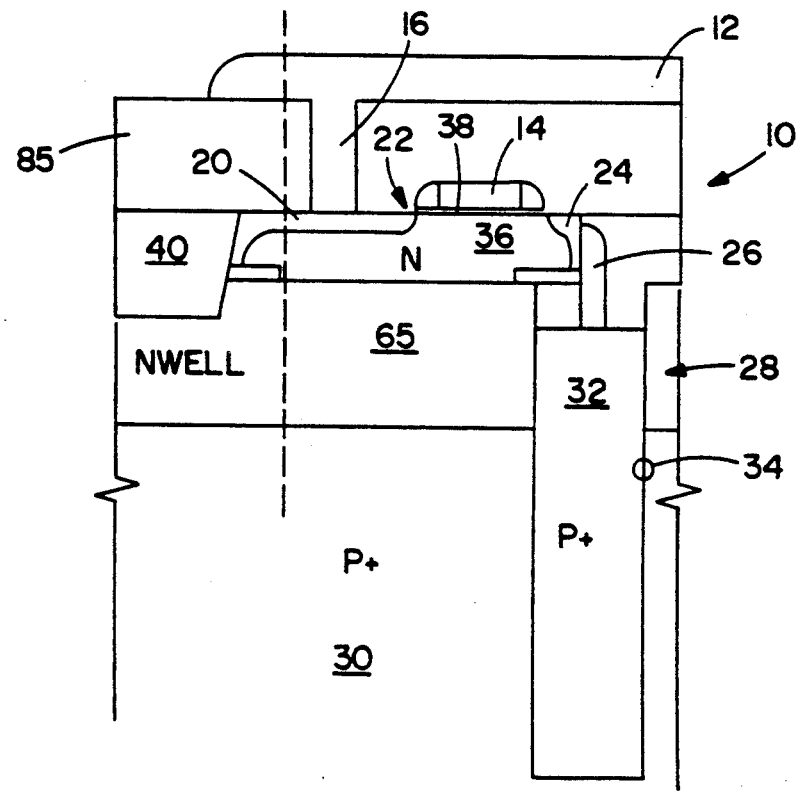
FIG. 2 is a cross-section of FIG. 1, taken along line 2—2.

Referring now to FIGS. 1 and 2, a DRAM memory cell 10 is emplaced at each intersection of a bit line 12 and a word line 14. Bit line 12, via contact 16, makes connection with a source contact 20 of an FET transistor 22. A drain contact 24 of transistor 22 connects, via strap connector 26 to a buried trench-capacitor 28, that resides in substrate 30. Trench capacitor 28 includes a polysilicon contact region 32 which is surrounded by a thin, insulating layer 34. An N region 36 provides a conduction channel beneath gate area 38 in transistor 22. Bordering either side of cell 10 (see FIG. 1), are shallow trench isolation areas 40. It can additionally be seen from FIG. 1 that transistor 22 is emplaced on a mesa area 42 that extends parallel to word line 14 across the width of the cell. It is to be noted that a number of details of the DRAM cell have been omitted from FIG. 1 to simplify its showing.

Turning now to FIGS. 3-9, the method of fabrication employed to achieve the DRAM cell shown in FIGS. 1 and 2 will be hereinafter described.

Figure 3:
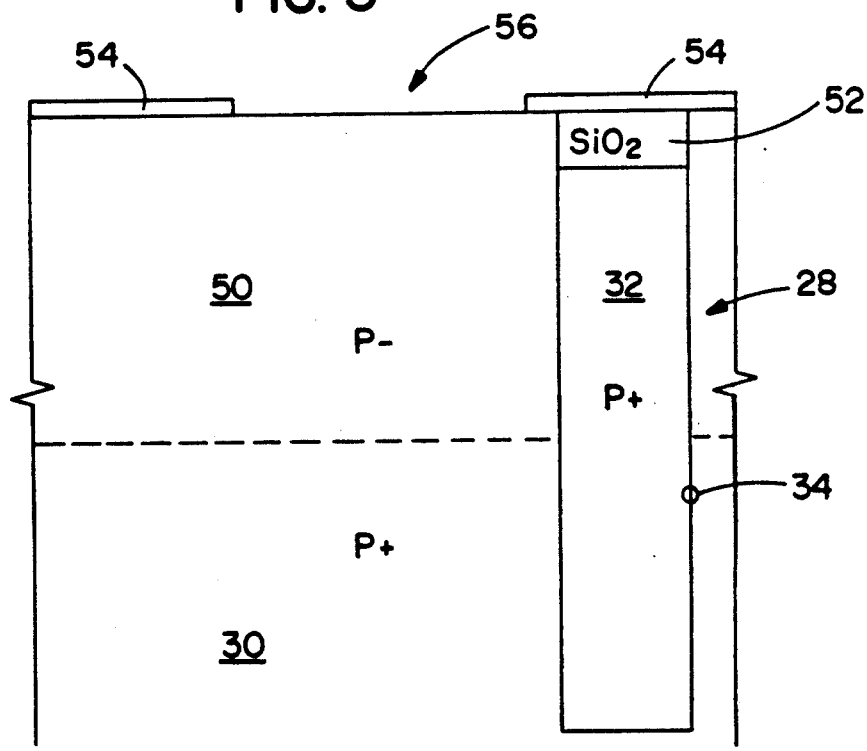
FIGS. 3-10 show schematic, cross-sectional views of the memory cell, illustrating various stages of its fabrication, employing a method in accordance with the principles of the present invention.

In FIG. 3, a p(+) substrate 30 has had grown thereon, a p(−) epitaxial layer 50. In addition, a buried storage capacitor 28 has been emplaced therein using known trench technology. The inner contact 32 of trench capacitor 28 is comprised of p(+) polysilicon and contacts one side of thin insulating layer 34, which is comprised of an $SiO_2$/SiN composite. An $SiO_2$ oxide cap 52 is grown to render the upper level of trench capacitor 28 coplanar with the uppermost surface of epitaxial layer 50. Subsequently, a thin $SiO_2$ layer 54 is grown and then patterned to provide access to p(−) epitaxial layer 50 through opening 56. The extent of opening 56 can be seen on FIG. 1 and, as will be hereinafter understood, exposes a seed area for further silicon growth.

Figure 4:
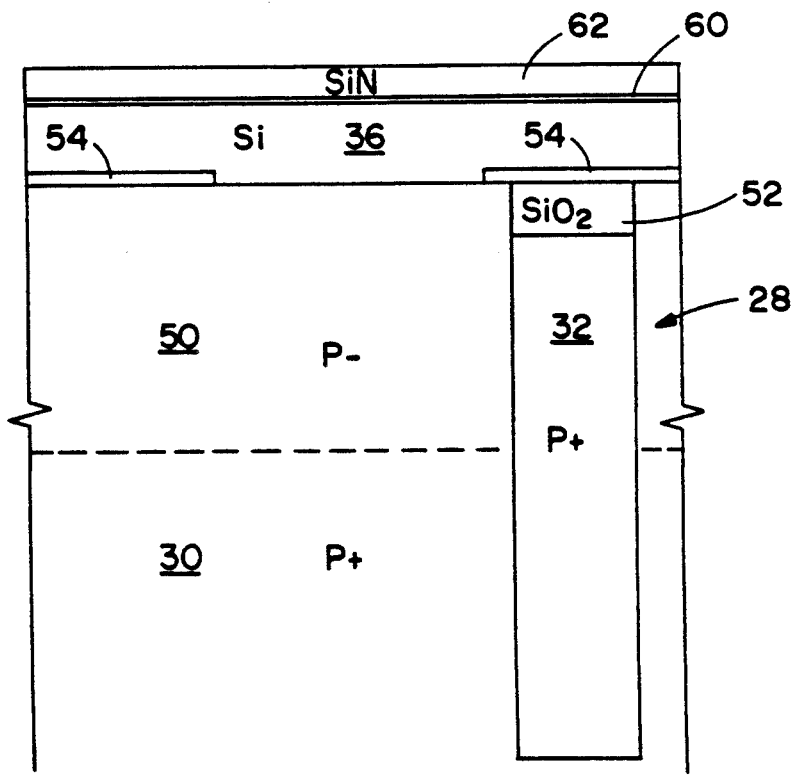

Turning now to FIG. 4, employing p(−) epitaxial layer 50 as a seed, a layer of epitaxial silicon 36 is grown and laterally covers buried storage capacitor 28, thin oxide patterns 54 and cap oxide 52. Subsequently, a thin buffer oxide layer 60 of $SiO_2$ is deposited on silicon layer 58, followed by deposition of a nitride layer 62 thereover.

Figure 5:
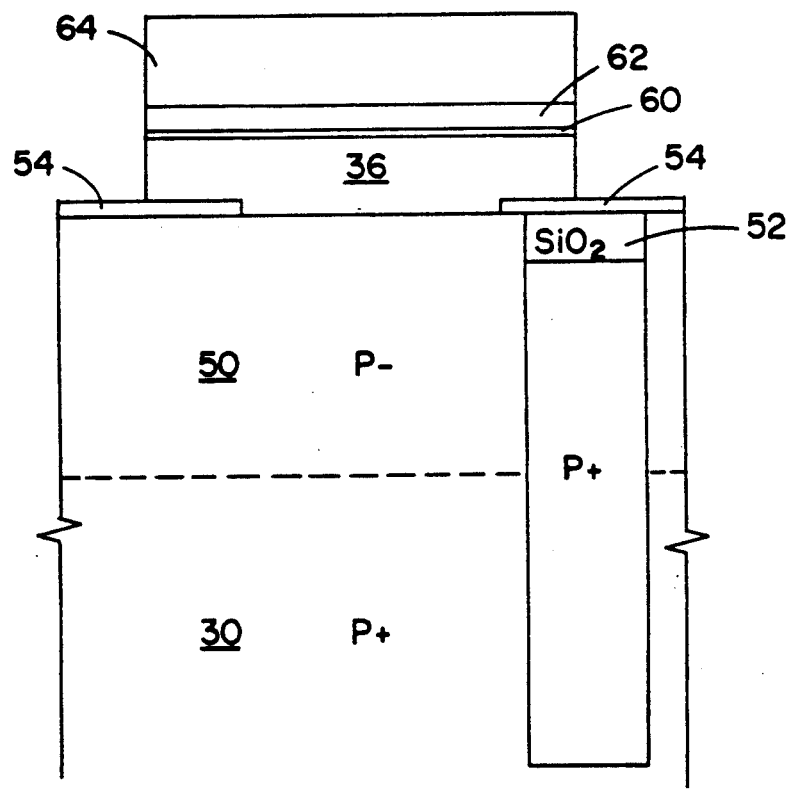

In FIG. 5, a photoresist layer 64 is emplaced over nitride layer 62. Regions not protected by photoresist layer 64 are then etched, preferably using a chlorine-based gas etchant (e.g., $SiCl_4$). It is to be noted that $SiO_2$ layers 54 serve as an etch stop during such a selective gas etch.

Figure 6:
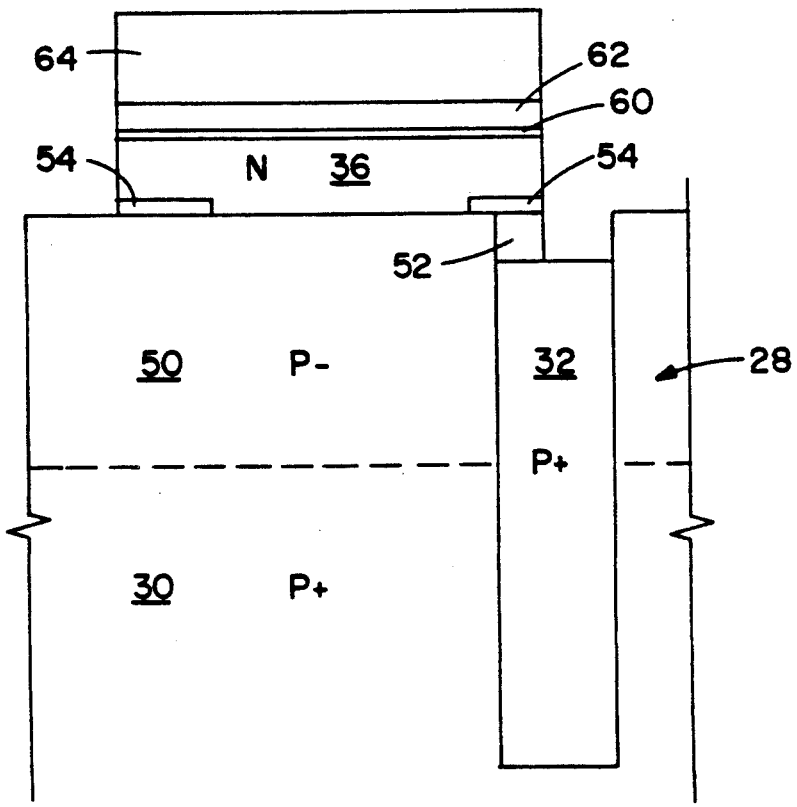
Figure 7:
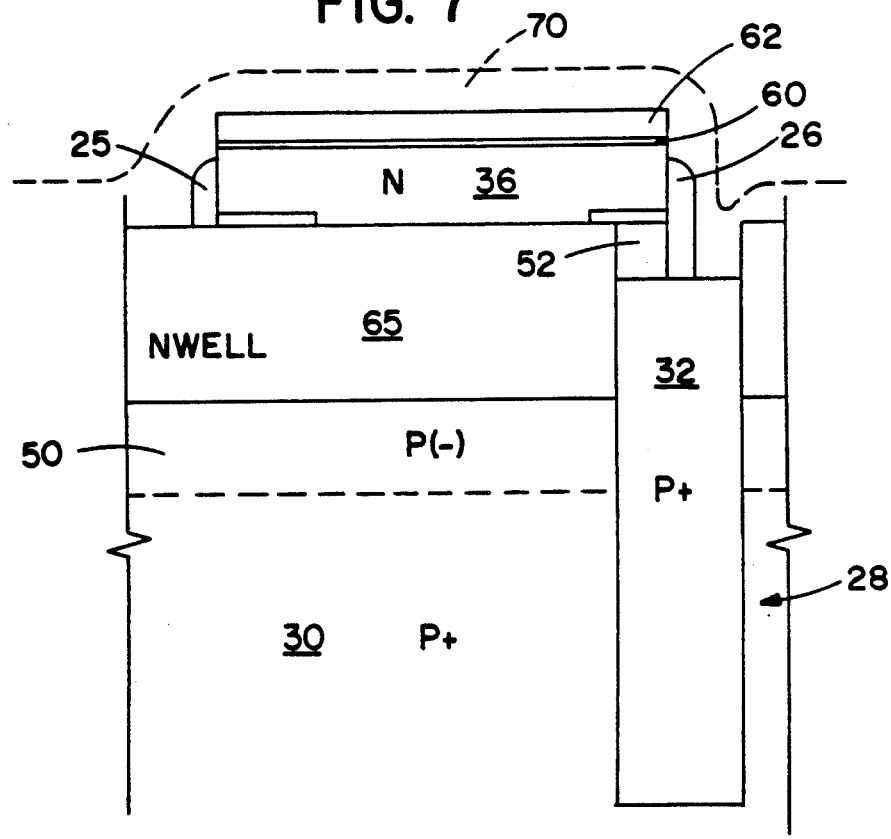

Subsequently, as shown in FIG. 6, the structure of FIG. 5 is subjected to a further etch using a hydrogen/$CF_4$ mixture which enables erosion of $SiO_2$ layers 54 and cap 52 in areas where they are not protected by photoresist 64. In this instance, within capacitor 28, the p(+) polysilicon layer 32 acts as an etch-stop as do exposed p(−) epitaxial Si layers 50. While the above-noted etchants are preferred, other gas plasma or reactive ion etching constituents, that are selective for $SiO_2$ may be substituted.

At this stage of the processing, a mesa has been constructed and a pathway has been opened to one contact of capacitor 28. Subsequently, (FIG. 7), photoresist 64 is removed to expose the uppermost layer of p(−) epitaxial region 50 for an n-well formation. An n-type dopant is then implanted through the mesa (silicon layer 36, $SiO_2$ layer 60, and nitride layer 62) and into p(−) epitaxial layer 50 to form an n-well region 65. Photoresist (not shown) is employed outside n-well region 65 to block the n-type implantation into n-channel device regions. Subsequent to that photoresist being removed, a short thermal cycle is applied to anneal the selective epitaxial silicon and to drive in the n-type dopants into the substrate.

Figure 8:
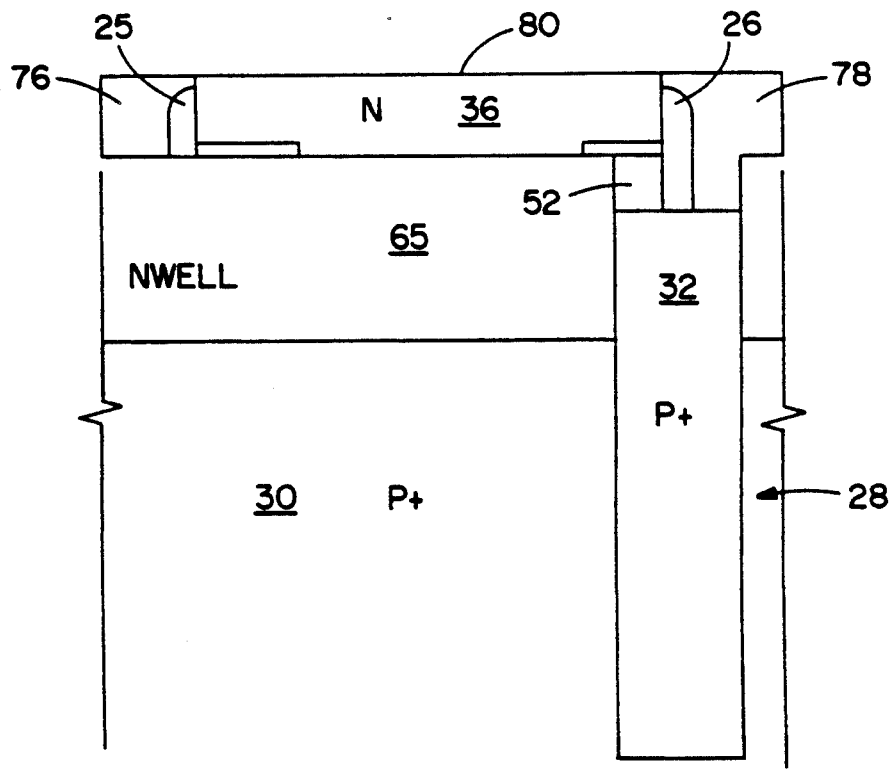

Next, a p(+) polysilicon layer 70 (shown in phantom) is chemically deposited over the mesa and the surface of the substrate. A subsequent reactive ion etch removes most of p(+) polysilicon layer 70, leaving only thin sidewall p(+) polysilicon strap areas 25 and 26. A silicon oxide layer is then chemically deposited over the entire upper surface (not shown). A chemical/mechanical polishing planarization technique is employed subsequently to remove the uppermost layers of the silicon oxide, followed by a chemical etch of silicon nitride layer 62, followed by an additional chemical polish of silicon dioxide layer 60. As a result, a planarized structure, as is shown in FIG. 8, is produced. The regions surrounding n region 36 are filled with $SiO_2$ deposits 76 and 78 and remain from the previously-described chemically deposited silicon oxide layer. At this stage, a planar upper surface 80 is presented for further processing.

Figure 9:
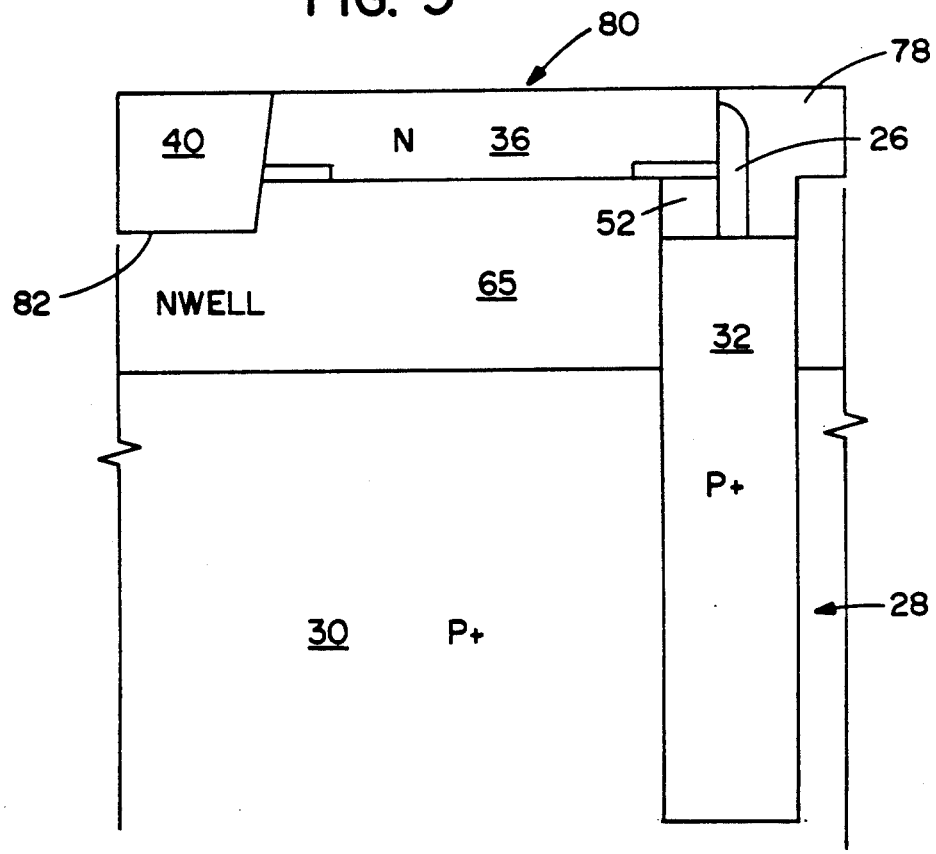

As shown in FIG. 9, upper surface 80 is again patterned using an appropriate photoresist (not shown), and shallow trenches 82 are created using reactive ion etching. Subsequently, an appropriate oxide 40 is deposited over the entire surface so that trenches 82 are filled. It is to be noted that this process removes sidewall polysilicon strap 25 but does not affect strap 26. Subsequently, a reactive ion etch or chemical mechanical planarization technique is employed to again create a planar surface between oxide isolation deposits 40 and upper surface 80 of the substrate.

Figure 10:
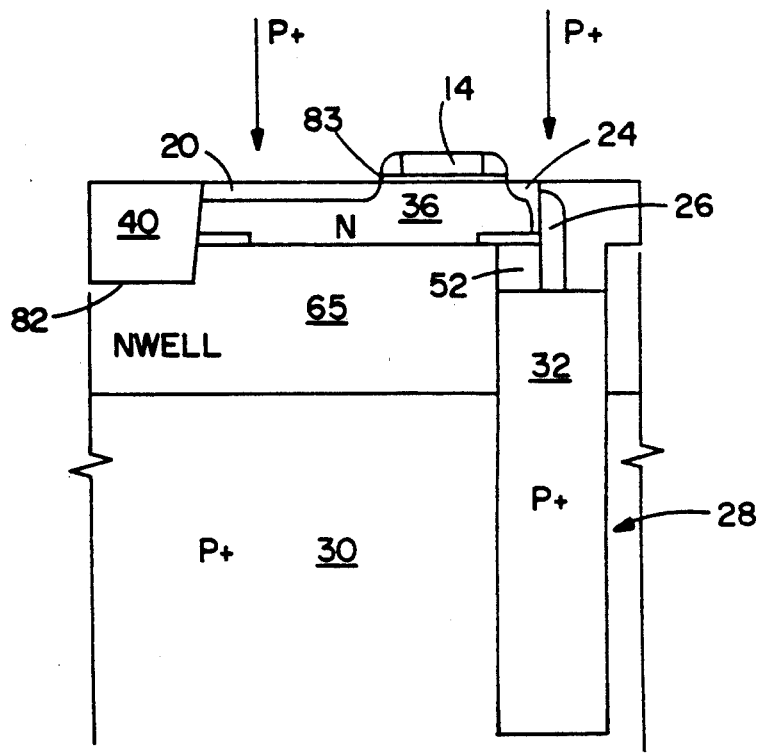

Next, (see FIG. 10) a gate oxide 83 is deposited over N region 36 and a subsequent polysilicon layer 14 is deposited to form both the word line and the gate conductive material. Subsequently, an ion implantation occurs of p(+) dopant materials to create both source 20 and drain 24. An annealing step is then performed causing the p(+) dopants to migrate from drain 24 into strap region 26, thereby creating a self-aligned contact between drain 24 and p(+) polysilicon contact 32, via strap 26.

Referring now back to FIG. 2, a thick additional oxide layer 85 is deposited upon the upper surface of the substrate followed by the provision of a contact post 16 to source region 20 and a selective deposition of a polysilicon layer 12 as the wordlines.

Figure 11:
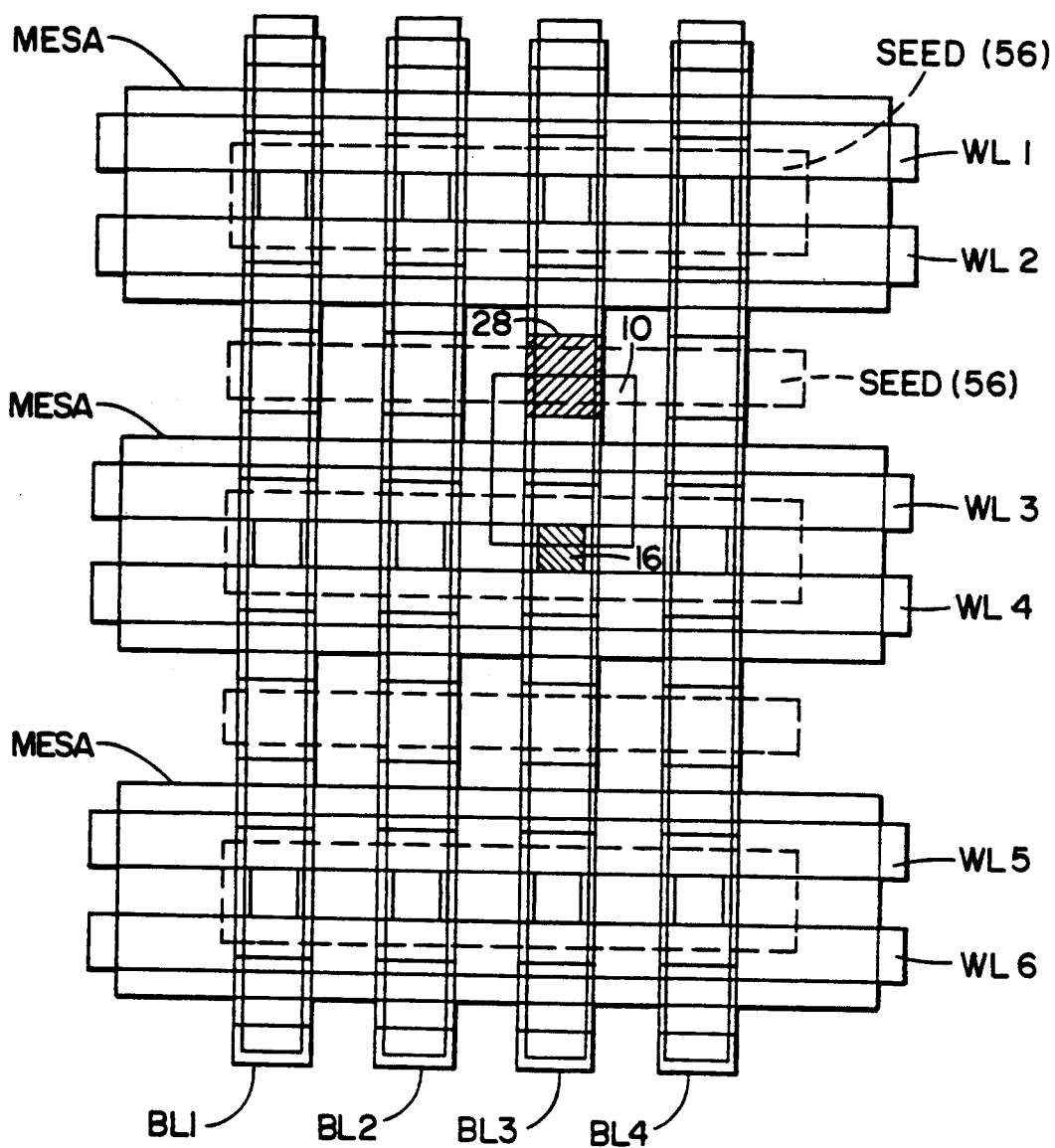
FIG. 11 is a plan view of a DRAM showing the interrelationship of memory cells constructed in accordance with the present invention.

Referring now to FIG. 11, a planar view of a multi-cell DRAM is shown indicating the presence of cell 10 therein. The seed areas correspond to openings 56 shown in FIG. 3. Trench capacitor 28 is shown in cross hatch, as is bit line contact 16.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for fabricating a DRAM memory cell in a monocrystalline substrate, said cell including an FET transistor and a capacitor, said method comprising the steps of:

a. providing a buried storage capacitor in a trench in said substrate;

b. forming a semiconductor mesa area juxtaposed to said buried storage capacitor;

c. opening a channel to a contact of said buried storage capacitor;

d. depositing a semiconductor layer over said mesa area and in said channel;

e. removing a substantial portion of said semiconductive layer, leaving at least a connecting portion deposited in said channel and in communication with said semiconductor mesa; and f. forming on said mesa at least a gate structure and source and drain regions, whereby said connecting portion provides a conductive path between a said region and said capacitor.

2. The method as defined in claim 1, said step (f) further comprising:

f1. doping said mesa area and said connecting portion, whereby source and drain regions are created about said gate structure, said connecting portion providing a connection between a said region and said contact of said storage capacitor.

3. The method as defined in claim 1, wherein said semiconductor mesa area formed in step (b) overlaps a portion of said buried storage capacitor.

4. The method as defined in claim 2 wherein said step (a) further comprises:

a1. depositing an oxide cap over a contact to said buried capacitor.

5. The method as defined in claim 4, said step (b) further comprising:

b1. growing an epitaxial layer of semiconductor material over said substrate; and b2. masking and etching said epitaxial layer to provide said semiconductor mesa area, said oxide cap over said capacitor contact acting as an etch stop.

6. The method as defined in claim 5 wherein said step (c) comprises the additional step of:

c1. etching a channel through said oxide cap to expose said capacitor contact.

7. The method as defined in claim 6 comprising the further steps of:

g. depositing a wordline connecting said gate structure to other gate structures in said DRAM;

h. providing a bit line connecting a said region which is not connected to said capacitor, to other complementary regions on said DRAM.

8. The method as defined in claim 1, said step f further comprising the steps of:

f1. depositing an oxide layer over said substrate; and f2. removing portions of said oxide layer to create a planar surface.

9. The method as defined in claim 8 wherein step f comprises the additional steps of:

f3. etching said planar surface to create shallow isolation trenches about said DRAM memory cell;

f4. depositing an oxide layer into said trenches; and f5. removing portions of said oxide layer to create a planar surface which exposes said semiconductor mesa area.

* * * * *